United States Patent [19]

Hoffmann et al.

[11] 4,169,249

[45] Sep. 25, 1979

[54] ANALOG NOISE GENERATOR

[75] Inventors: Jean-Claude Hoffmann; Francis Castanie, both of Toulouse; Henri Crabere, L'Union; Jean-Pierre Verdier, Cazeres; Norbert Voisin, Bruguieres, all of France

[73] Assignee: Societe Nationale Industrielle Aerospatiale, Paris, France

[21] Appl. No.: 898,685

[22] Filed: Apr. 21, 1978

[30] Foreign Application Priority Data

May 6, 1977 [FR] France .................. 77 13885

[51] Int. Cl.² .................................. H03B 29/00
[52] U.S. Cl. ................................. 331/78; 328/59
[58] Field of Search ............... 331/78; 235/152; 328/59

[56] References Cited

U.S. PATENT DOCUMENTS

| | | | |
|---|---|---|---|
| 3,582,882 | 6/1971 | Titcomb et al. | 331/78 X |
| 3,612,845 | 10/1971 | Lawlor | 331/78 X |
| 3,706,941 | 12/1972 | Cohn | 331/78 |

Primary Examiner—Siegfried H. Grimm
Attorney, Agent, or Firm—Merriam, Marshall & Bicknell

[57] ABSTRACT

The present invention relates to a device for producing an analog noise from a point process, the distribution of said noise being predeterminable, said device comprising a source of noise, a first generator or random pulse generator, a second generator or motif or function generator, the output of the source of noise being connected to the input of the first generator, the output of the first generator being connected to the input of the second generator, and the output of the second generator constituting the output of the whole of said device. The invention is applicable to the coding and transmission of information.

4 Claims, 7 Drawing Figures

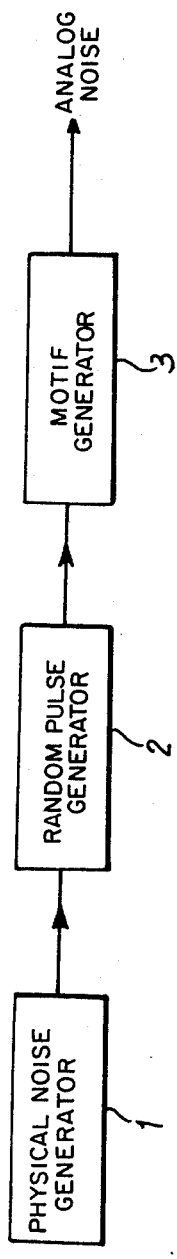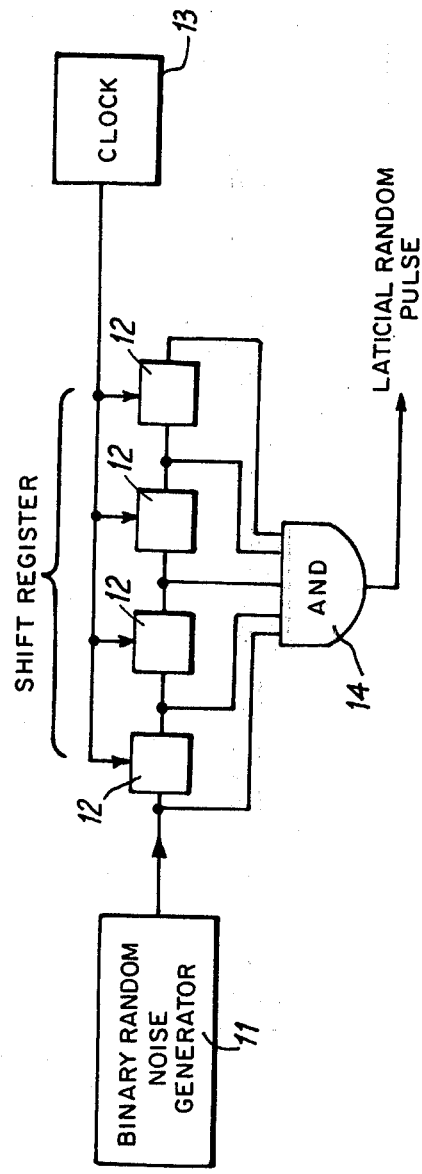

ANALOG NOISE GENERATOR

The present invention relates to an analog noise generator, enabling, in particular, a linear or non-linear analog-stochastic coding to be made.

Analog-stochastic coding is known to consist in converting an analog quantity x into a binary random variable, the mean of which contains information x. Said coding is usually made by comparing x with an analog noise with the aid of a comparator circuit whose output takes two states respectively, according to whether x is lower or greater than said noise. This output is called: stochastic code of x.

If the statistic average of the stochastic code is linear with x, it is said that the coding is linear. To this end, the analog noise generator used must be with uniform distribution. (Distribution: density of probability).

In the other cases, the distribution which leads to a predetermined non-linear stochastic coding must be calculated. Such a calculation is known to the man skilled in the art.

The present invention enables an analog noise generator with uniform or non-uniform, predeterminable distribution to be produced in original manner.

In the present technique, different devices exist which use for example a suitably chosen distortion of a physical noise such as a Gaussian noise (noise of resistor, of active components, etc...).

These devices are not very precise, presenting average- and longterm drifts. The small spectral extent of the noises thus obtained renders them unsuitable for stochastic calculation. Moreover, the necessary complexity of these devices renders production thereof prohibitive, particularly for modular applications.

The present invention remedies these drawbacks by using a point process as primary random phenomenon, said process initialising at each event a function generator. The function produced or motif is one of the statistic properties of said point process determining entirely the distribution of the analog noise produced.

As used herein, the term "point process" refers to a sequence of events, each of which occurs in a time which can be considered an infinitely small fraction of a development period during which said events occur. In the present invention, the point process comprises a sequence of electrical pulses each of which has an abrupt leading edge or front, which may be used for controlling the operation of a second or "motif" generator to produce the desired analog noise.

One of the essential advantages of the invention is to allow the distribution of the analog noise to be chosen by selecting a motif adapted to the point process used.

The mathematical determination of such a motif is known by the man skilled in the art.

Another advantage of the invention resides in the simplicity of obtaining a point process allowing a good precision at the same time as a wide pass band.

Moreover, the invention may be carried out very simply and transposed very easily in modular form, advantageously for application to stochastic calculation.

The invention will be more readily understood on reading the following description with reference to the accompanying drawings, in which:

FIG. 1 shows a block diagram of the device according to the invention.

FIG. 5 shows another embodiment of the random pulse generator.

Applicants may demonstrate that, from any point process, the knowledge of one of its statistic properties noted Po(t), defined hereinbelow, enables a motif noted g(t) leading to a given distribution to be chosen.

Said statistic property Po(t) is defined as the probability of not having any event of the point process included in any interval of length t.

A linear motif g(t) starting at each event of the point process leads to an analog noise of distribution function $F(x) = 1 - Po(x)$.

An arbitrary motif g(t) makes it possible to obtain on the analog noise a determined distribution, equivalent to that which would have been obtained by non-linear conversion g(x) of the analog noise with distribution function $F(x) = 1 - Po(x)$.

Calculation of the motif g(t) which, associated with a point process provided with Po(t), leads to any distribution, is within the scope of the man skilled in the art.

In particular, a motif $g(t) = 1 - Po(t)$ leads to a uniform distribution.

The synthesis of the motif g(t) acts, in the present invention, the role of non-linear conversion of the conventional methods.

One of the functions Po(t) most frequently encountered in the point processes derived from physical noises, is $Po(t) = e^{-\lambda t}$. The motive g(t) here is expressed $g(t) = 1 - e^{-\lambda t}$, which may be produced by the circuit described in FIG. 6.

FIG. 1 shows a physical noise generator 1 whose output is connected to a shaping circuit of random pulse generator 2 supplying at its output random pulses which constitute the primary point process. These pulses are directed onto a motif generator 3, initialised or reinitialised respectively by each of said pulses.

The output of the motif generator 3 supplies an analog noise according to the object of the present invention.

Figure 2:
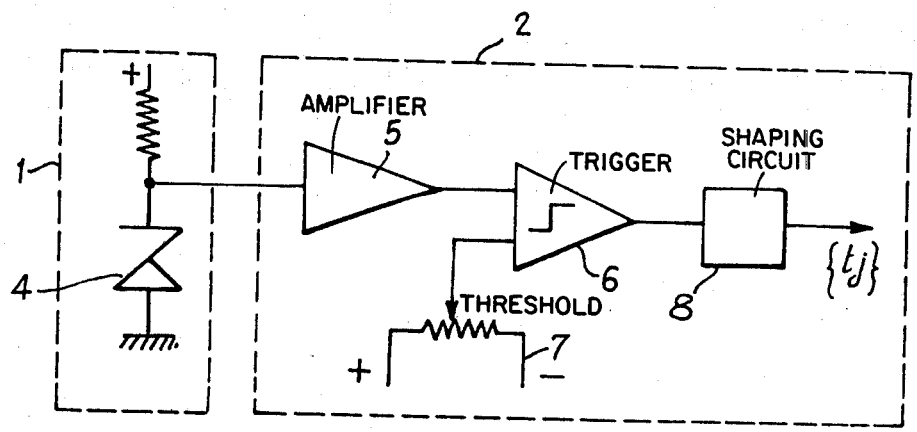
FIG. 2 shows an embodiment of a first random pulse generator according to a point process.

FIG. 2 shows a particular embodiment of 1 and of 2.

According to this embodiment, said generator 1 comprises a Zener diode 4 polarised with low current, so that it supplies at its output a noise of sufficient level and spectral extent. Said output is connected to the input of a wide band amplifier 5 whose output is connected to one of the two inputs of a voltage comparator 6 of the trigger type, the other input of said comparator being connected to a potentiometric circuit 7 adapted to fix the comparison threshold with the noise issuing from 5. The signals issuing from 6 are directed on a shaping circuit 8 enabling narrow pulses to be obtained.

According to this embodiment, the circuit 5, 6, 7 and 8 constitutes the random pulse generator 2.

Figure 3:
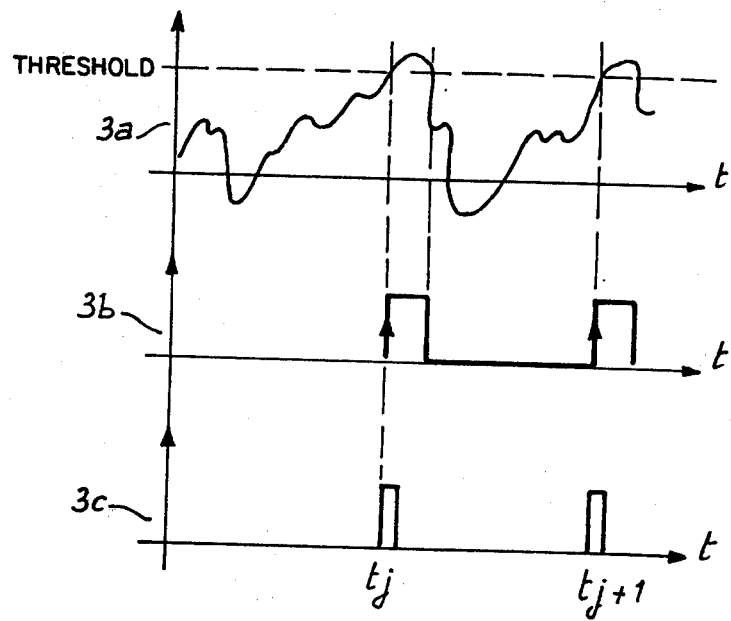
FIG. 3 illustrates the functioning of said first generator.

FIG. 3 shows an illustration of the functioning of the assembly 1-2, At 3a is shown the signal issuing from the diode 4, and a threshold level, on the y-axis, indicated in broken line and corresponding to the level regulated in the potentiometric circuit 7. 3b indicates the pulses supplied by the trigger 6 and 3c these same pulses after their passage in the circuit 8, which reduces them to a minimum width. Said circuit 8 may, for example, be constituted by a differentiator circuit comprising a diode in parallel on its resistor eliminating the negative pulses and followed by a logic gate or a monostable. Thus, the assembly 1-2 supplies pulses of small and constant width whose distribution in time is random. Their sequence is marked {tj}.

Figure 4:
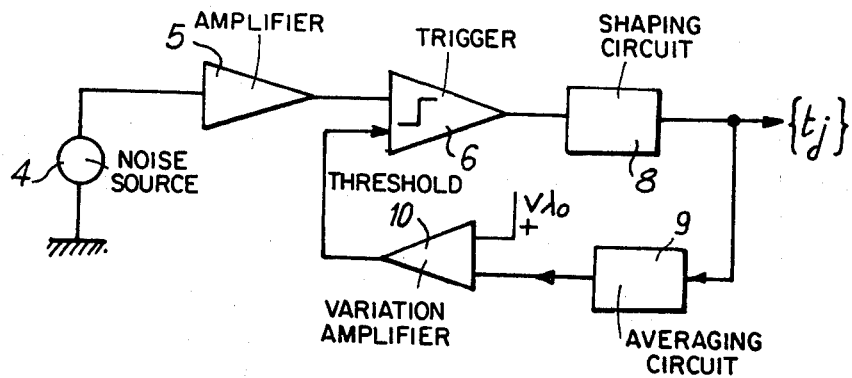
FIG. 4 shows an improved circuit by servo-control of said first generator.

In view of the variations in supply and temperature of the assembly and particularly the source of noise (physical noise generator 1), drifts or variations in the effective value of the noise, the density $\lambda$ (number of events per second, or here, number of random pulses per second) may drift and take values incompatible with obtaining the desired noise distribution of all the device according to the invention. It is therefore advantageous to regulate the parameter $\lambda$, and to this end, FIG. 4 shows a circuit according to FIG. 2 in which the comparison threshold of the input of the trigger 6 is determined by a regulation loop, in replacement of the potentiometric circuit 7.

Said loop comprises an averaging circuit 9 (for example an R-C integrator circuit), whose input is connected to the output of 8 or of 6 and whose output is connected to one of the inputs of a variation amplifier 10. The other input of said variation amplifier 10 is connected to a source supplying a continuous signal V $\lambda_o$ corresponding to the desired density $\lambda_o$. The output of 10 is connected to one of the inputs of the trigger circuit 6, the other receiving the signals from the noise amplifier 5.

Thus, the sequence of the pulses {tj} is averaged at 9 which supplies a continuous signal proportional to $\lambda$. This signal is compared by 10 with the signal V $\lambda_o$ and supplies a regulated trigger threshold signal to trigger 6.

According to the invention, it is possible to replace the physical noise generator by a binary random noise generator, and said first generator, or random pulse generator by a shift register whose outputs are respectively connected to the inputs of an AND gate, whose output supplies random pulses according to a BERNOUILLI latticial process. The elements of said shift register are synchronised by a clock.

FIG. 5 shows a binary random noise generator 11 whose output is connected to the input of a shift register 12 comprising n elements. The outputs of 12 are connected respectively to n+1 inputs of an AND gate 14 as well as the input of the first element. If the generator 11 furnishes pulses with a probability of $\frac{1}{2}$, the AND gate 14 will supply random pulses with a probability $p=(\frac{1}{2})$. With a register having four elements, a probability of less than 0.1 is obtained at the output of AND gate 14. A clock 13 serves to draw bits of probability $\frac{1}{2}$ supplied by 11, at random.

Figure 6:
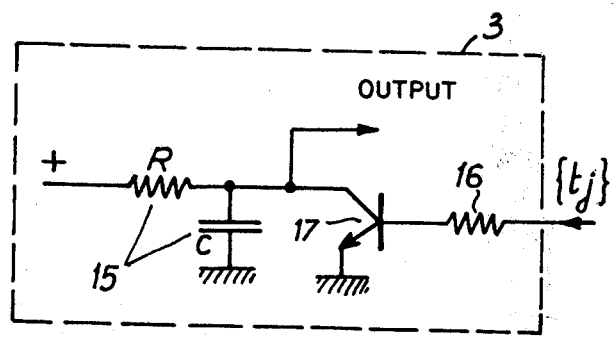
FIG. 6 shows an embodiment of a second generator or motif or function generator enabling a uniform distribution to be obtained from a Poisson point process.

FIG. 6 shows an embodiment of a second generator, or motif generator. According to this example, the combination of said second generator, said first generator and said source of noise enables a noise of uniform distribution to be obtained. An RC circuit 15 is shown, supplied by a D.C. + source and whose capacitor is shunted by a transistor 17 whose base is connected via a resistor 16 to the output of said first generator supplying a sequence of random pulses {tj}.

Each pulse issuing from said first generator renders said transistor conducting. Said latter enables the capacitor C to discharge and therefore reinitialises the R-C circuit.

An analog noise with uniform distribution is thus produced at the point of connection between resistor-capacitor of said R-C circuit, and said point of connection constitues the output of the whole of the complete device, according to the embodiment described hereinabove.

Figure 7:
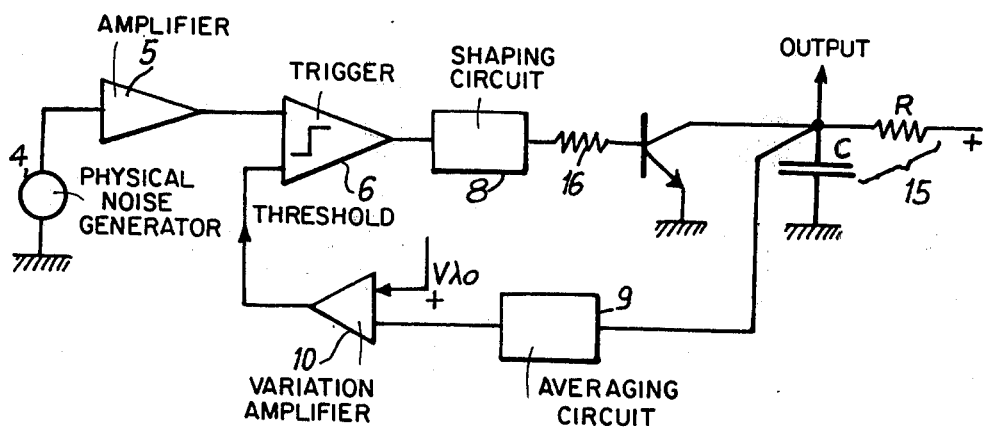
FIG. 7 shows an example of a complete analog noise generator with uniform distribution stabilised by servo-control.

FIG. 7 shows a particular embodiment of the invention constituting a combination of the elements described in FIGS. 4 and 6, but according to which the input of the averaging circuit 9 is connected to the point of connection between resistor-capacitor of said R-C circuit 15, and not to the output of 6 or of 8.

The equivalent elements of the different Figures have the same references.

The density regulating loop has, according to this original embodiment, its input connected to the output of the whole of the device and its output on an input of the trigger 6. The density $\lambda$ of the random pulses is, in this circuit, regulated as a function of the distribution of the analog noise issuing from the point of connection between resistor and capacitor of said R-C circuit.

According to this embodiment, the analog noise obtained has a uniform distribution.

Said second generator 3 may also be constituted by any initialisable and reinitialisable function generator whose function is predeterminable.

What we claim is:

1. A device for generating an analog noise from a point process, the distribution of said noise being predeterminable, said device comprising:
    a first generator assembly generating a sequence of random pulses;
    a second generator assembly comprising an integrator RC circuit supplied by a D.C. source, said RC circuit having a capacitor shunted by a controlled switch having a control electrode;
    means for applying said sequence of random pulses to said control electrode, said controlled switch taking the ON state during each of said random pulses; and
    means for picking up said analog noise from a point between the resistor and the capacitor of said RC circuit.

2. A device according to claim 1, wherein said first generator assembly comprises:
    a physical noise source; and
    a comparator circuit with two inputs, one of which is supplied by said physical noise source and the other of which is supplied by a circuit establishing a threshold, said comparator circuit supplying a pulse each time the level of said physical noise exceeds said threshold, whereby said sequence of random pulses is produced.

3. A device according to claim 2, wherein said threshold circuit comprises:
    an averaging circuit having an input which is connected to a point between the resistor and the capacitor of said RC circuit;
    a variation amplifier having two inputs, one of which is connected to the output of said averaging circuit and the other of which is connected to a DC source of a predetermined magnitude;
    and means connecting the output of said variation amplifier to an input of said comparator circuit.

4. A device according to claim 1, wherein said first generator assembly comprises:

a shift register having an input and a plurality of outputs;

a binary random noise source having an output connected to an input of said shift register;

an AND gate having an output and a plurality of inputs, said inputs being connected to the outputs of said shift register; and a clock for synchronizing said shift register;

the output of said AND gate being connected to said control electrode, said controlled switch taking the ON state during each of the pulses produced by said AND gate.

* * * * *

UNITED STATES PATENT AND TRADEMARK OFFICE
CERTIFICATE OF CORRECTION

PATENT NO. : 4,169,249
DATED : September 25, 1979
INVENTOR(S) : Jean-Claude Hoffmann et al.

It is certified that error appears in the above-identified patent and that said Letters Patent are hereby corrected as shown below:

Col. 3, line 53 "p=(1/2)" should be

--$p=(1/2)^n$--

Signed and Sealed this

Eighteenth Day of March 1980

[SEAL]

*Attest:*

*Attesting Officer*

SIDNEY A. DIAMOND

*Commissioner of Patents and Trademarks*